United States Patent

Marokkey et al.

(10) Patent No.: US 7,514,356 B2
(45) Date of Patent: Apr. 7, 2009

(54) RIBS FOR LINE COLLAPSE PREVENTION IN DAMASCENE STRUCTURES

(75) Inventors: Sajan Marokkey, Wappingers Falls, NY (US); O Seo Park, Hopewell Junction, NY (US); Wai-Kin Li, Poughkeepsie, NY (US); Todd C. Bailey, Fishkill, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 349 days.

(21) Appl. No.: 11/069,068

(22) Filed: Mar. 1, 2005

(65) Prior Publication Data

US 2006/0199369 A1  Sep. 7, 2006

(51) Int. Cl.
*H01L 21/4763* (2006.01)
(52) U.S. Cl. .................... 438/638; 257/E21.579
(58) Field of Classification Search .............. 438/669, 438/638; 257/E21.579
See application file for complete search history.

(56) References Cited

U.S. PATENT DOCUMENTS 6,340,631 B1 * 1/2002 Chih-Po et al. ............ 438/618

OTHER PUBLICATIONS

Wolfe. S. et al., Silicon Processing for the VLSI Era, 2000, Lattice Press, vol. 1, p. 798.*

* cited by examiner

*Primary Examiner*—Asok K Sarkar
(74) *Attorney, Agent, or Firm*—Slater & Matsil, L.L.P.

(57) ABSTRACT

A method of preventing resist line collapse in damascene structures and a structure thereof is disclosed. A damascene pattern for resist lines is enhanced with ribs extending therefrom. The ribs provide mechanical support for resist lines and improve the lithography process for forming the resist lines, particularly when a negative focus is used. The ribs may extend between vias in an underlying material layer. The method results in structurally strong resist lines for damascene structures that are less likely to collapse.

22 Claims, 8 Drawing Sheets

RIBS FOR LINE COLLAPSE PREVENTION IN DAMASCENE STRUCTURES

TECHNICAL FIELD

The present invention relates generally to the design and manufacture of semiconductor devices, and more particularly to the fabrication of damascene structures in integrated circuits.

BACKGROUND

Generally, semiconductor devices are electrical devices that utilize a semiconductor as a material component. Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Metallization layers are usually the top-most layers of semiconductor devices. The manufacturing of semiconductor devices is typically classified into two phases, the front end of line (FEOL) and the back end of line (BEOL). The BEOL is typically considered to be the point of the manufacturing process where metallization layers are formed, and the FEOL is considered to include the manufacturing processes prior to the formation of metallization layers.

While some integrated circuits have a single top layer of metallization, other integrated circuits comprise multi-level interconnects, wherein two or more metallization layers are formed over a semiconductor wafer or workpiece. Each conductive line layer typically comprises a plurality of conductive lines separated from one another by an insulating material, also referred to as an inter-level dielectric (ILD). The conductive lines in adjacent horizontal metallization layers may be connected vertically in predetermined places by vias formed between the conductive lines.

In the past, aluminum was used as a conductive line material in integrated circuits, which is easy to subtractively etch. As semiconductor devices are scaled down in size, there is a trend towards the use of copper for interconnect material, which is more conductive than aluminum. However, copper is difficult to subtractively etch, and thus, damascene processes are typically used to form copper conductive features.

In a damascene process, a material such as a dielectric is deposited over a wafer, and then the material is patterned with a conductive feature pattern. The conductive feature pattern typically comprises a plurality of trenches (for conductive lines), or apertures (for vias), for example. The trenches or apertures are then filled in with conductive material, and a chemical-mechanical polish (CMP) process and/or etch process is used to remove the excess conductive material from the top surface of the patterned material. The conductive material remaining within the patterned material comprises conductive features such as conductive lines and/or vias.

Damascene processes are typically either single or dual damascene. In a single damascene process, one metallization layer is formed at a time. In a dual damascene process, two adjacent horizontal layers are patterned, e.g., by forming two lithography patterns in two insulating material layers such as dielectric layers or in a single insulating material layer. The two patterns are then filled in with conductive material, and a CMP process is used to remove excess conductive material from over the insulating material layer, leaving patterned conductive material in the insulating material layers. For example, the patterns may comprise trenches for conductive lines in one insulating material layer portion and apertures for vias in the underlying insulating material layer portion. Thus, in a dual damascene process, conductor trenches and via apertures are filled in one fill step.

Figure 1:
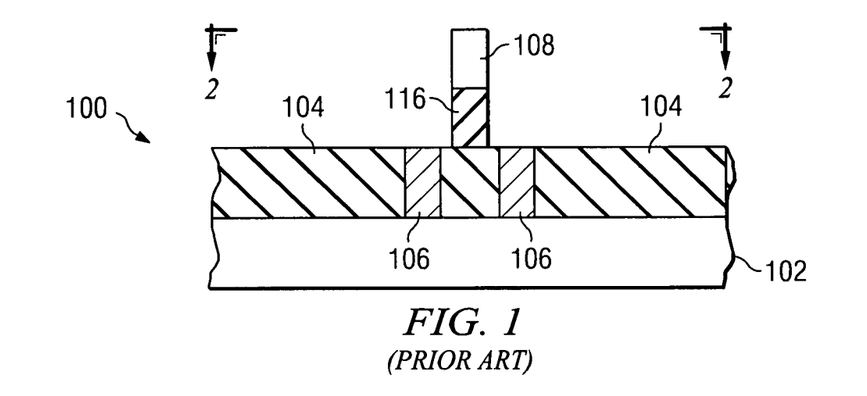
FIG. 1 shows a cross-sectional view of a prior art semiconductor device, illustrating a thin resist line for a damascene structure that is prone to collapsing.
Figure 2:
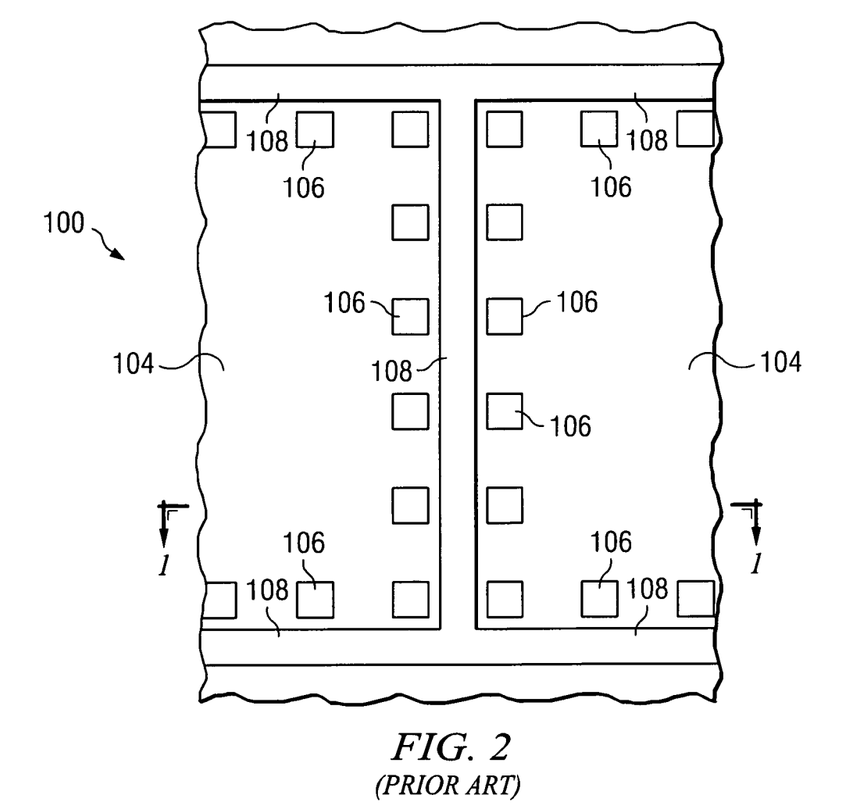
FIG. 2 shows a top view of the prior art semiconductor device shown in FIG. 1.

A prior art semiconductor device 100 comprising a single damascene structure is shown in FIG. 1 in a cross-sectional view and in FIG. 2 in a top view. A plurality of vias 106 is formed in a first insulating material layer 104 over a workpiece 102. The vias 106 may be formed in a single damascene process within the first insulating material layer 104, for example. A plurality of conductive features will be formed in a second insulating material layer 116 disposed over the first insulating material layer 104. To form the conductive features, a layer of resist 108 is deposited over the second insulating material layer 116, and the layer of resist 108 is patterned with a desired pattern for the conductive features. The layer of resist 108 is used as a mask to pattern the second insulating material layer 116, the layer of resist 108 is removed, and the second insulating material layer 116 is filled with a conductive material to form the conductive features. In a dual damascene process, the vias 106 are not filled prior to the patterning of the second insulating material layer 116, but rather, the vias 106 are formed simultaneously with the filling of the second insulating material layer 116 with conductive material.

In the structure shown, the conductive features to be formed in the second insulating material layer 116 comprise contact pads, which are rectangular or square, for example. The contact pads will be formed over and will make electrical contact to one or more of the vias 106, as shown. The pattern in the layer of resist 108 defines the shape of the conductive features.

A problem with the prior art structure and process shown and described with reference to FIGS. 1 and 2 is that the pattern in the layer of resist 108 comprises long, thin resist lines that are fragile and tend to be thinner at the bottom of the resist 108 proximate the via layer 104/106. The pattern in the layer of resist 108 has a high aspect ratio, e.g., about 3:1 or greater, for example. Thus, the resist 108 lines have a tendency to collapse.

To decrease the resist line collapse problem in the BEOL, sub-resolution assist features such as serifs and phase shifters are often used. Optical proximity correction (OPC) is used to generate the sub-resolution features on lithography masks. However, OPC is complex and time-consuming, and often does not completely prevent resist line collapse, particularly in resist line patterns that are very small and are relatively isolated from other features, and also when a negative focus is used for the lithography process, for example.

SUMMARY OF THE INVENTION

These and other problems are generally solved or circumvented, and technical advantages are generally achieved, by preferred embodiments of the present invention, which provide methods of mechanically strengthening resist lines used to form damascene structures. Ribs are added to a damascene pattern for resist lines. The ribs extend from the damascene pattern, providing mechanical support and improving the lithography process for patterning the resist lines.

In accordance with a preferred embodiment of the present invention, a method of fabricating a semiconductor device includes providing a workpiece, depositing a masking material over the workpiece, and patterning the masking material with a pattern for a damascene structure. The pattern comprises at least one line, and a plurality of ribs extending from the at least one line.

In accordance with another preferred embodiment of the present invention, a method of fabricating a semiconductor device includes providing a workpiece, depositing a first insulating material layer over the workpiece, and depositing a second insulating material layer over the first insulating material layer. The first insulating material layer and the second insulating material layer are patterned with a pattern for a plurality of vias. A layer of resist is deposited over the second insulating material layer. The layer of resist is patterned with a pattern for at least one conductive feature and a pattern for a plurality of ribs extending from the at least one conductive feature pattern. At least one of the plurality of ribs in the pattern for the plurality of ribs extends between two of the plurality of vias in the pattern for the plurality of vias in the underlying first insulating material layer. The layer of resist is used as a mask to pattern the second insulating material layer, and the patterned layer of resist is removed. A first conductive material is deposited over the patterned second insulating material layer, leaving excess first conductive material over a top surface of the patterned second insulating material layer, and the excess first conductive material is removed from over the top surface of the patterned second insulating material layer.

In accordance with yet another preferred embodiment of the present invention, a method of designing a semiconductor device includes determining a layout for a damascene structure, and adding a plurality of ribs to the layout for the damascene structure. Each of the plurality of ribs extends from the damascene structure to provide mechanical support for the damascene structure.

In accordance with another preferred embodiment of the present invention, a semiconductor device includes a workpiece, a plurality of vias formed in a first insulating material layer disposed over the workpiece, and a plurality of conductive features formed in a second insulating material layer disposed over the plurality of vias and the first insulating material layer. Each of the plurality of conductive features comprises a plurality of ribs disposed at the perimeter thereof, wherein at least one of the plurality of ribs extends over a via in the underlying first insulating material layer.

Advantages of preferred embodiments of the present invention include adding ribs to resist lines used to form damascene structures, for mechanical support and improved lithography processes. The ribs may be added to the lithography mask pattern after OPC is performed on the lithography mask data, reducing the amount of time required and complexity of the OPC calculations.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely with respect to the formation of damascene conductive features using a layer of resist. The invention may also be applied, however, to the formation of other damascene structures, such as insulators or semiconductive materials, formed by patterning other types of materials with a damascene pattern.

BEOL lithography processes suffer from a resist line collapse problem, as described with reference to FIGS. 1 and 2. The resist line collapse problem becomes more of an issue as dimensions shrink. Embodiments of the present invention provide a low cost solution to prevent resist lines from collapsing, by reinforcing the resist lines with ribs, to be described further herein.

Figure 3:
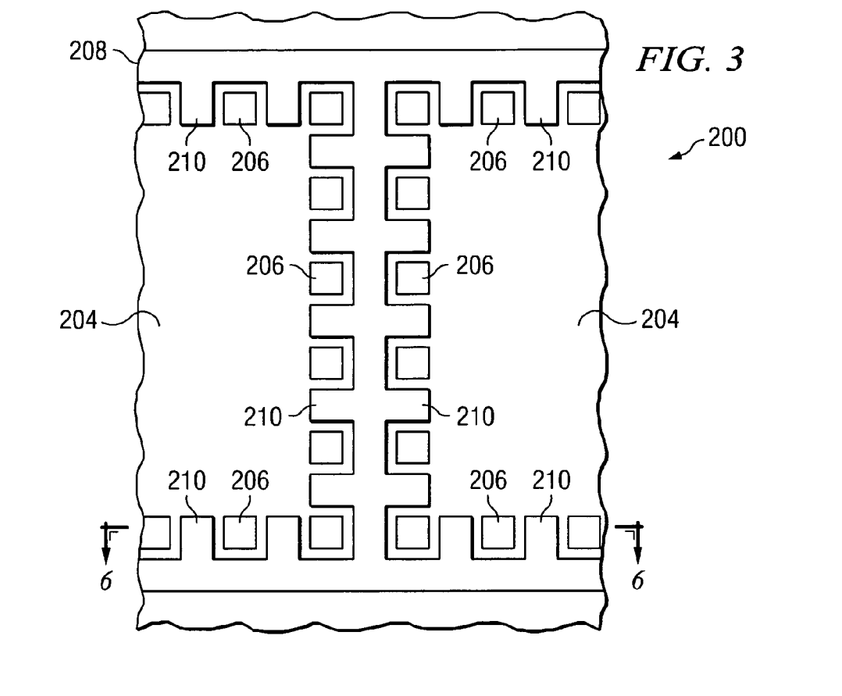
FIG. 3 shows a top view of an embodiment of the present invention, wherein resist lines for a damascene pattern include a plurality of square shaped ribs extending therefrom.

With reference now to FIG. 3, there is shown a top view of a semiconductor device 200 in accordance with an embodiment of the present invention, wherein a resist layer 208/210 patterned in a damascene pattern includes resist lines 208 including a plurality of square shaped ribs 210 extending therefrom. The pattern of the ribs 210 is disposed on the lithography mask (not shown) that is used to pattern the layer of resist 208/210, along the length of the pattern for the resist lines 208. When the layer of resist 208/210 is exposed to transfer the pattern of the lithography mask to the layer of resist, the resist lines 208 and the ribs 210 are formed in the layer of resist 208/210.

Figure 6:
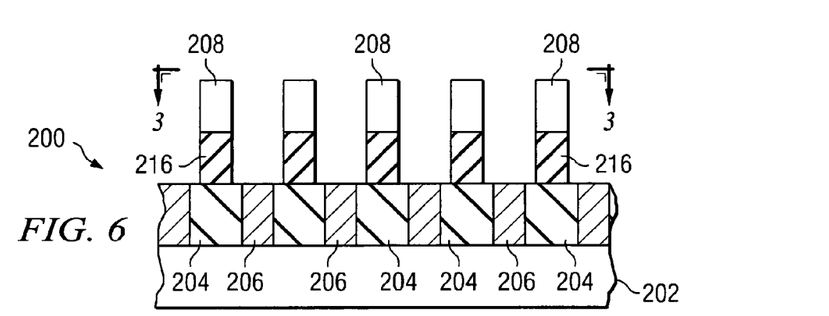
FIGS. 6 through 8 show cross-sectional views of a preferred embodiment of the present invention at various stages of manufacturing.
Figure 7:
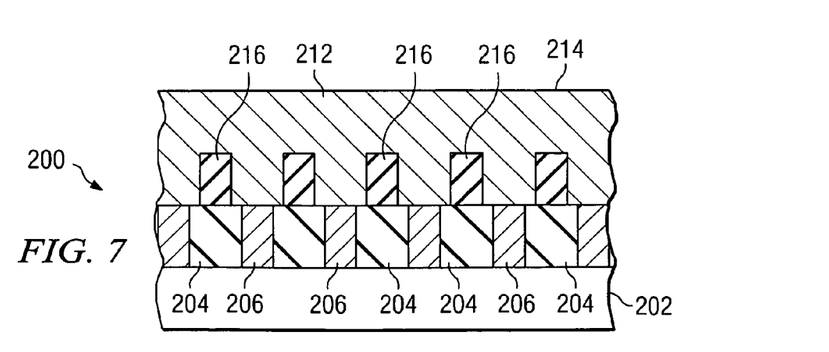
Figure 8:
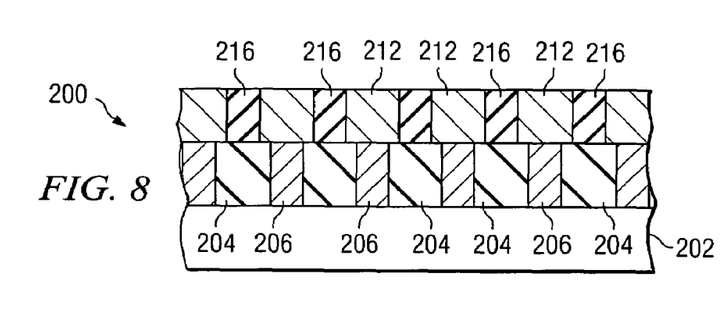

This resist pattern 208/210 is etched and patterned in the underlying insulating material layer 216 (not shown in FIG. 3; see the cross-sectional views in FIGS. 6 through 8). The layer of resist 208/210 is then removed, and a conductive material 214 (also not shown in FIG. 3; see FIGS. 6 through 8) is formed over the patterned insulating material layer. Excess conductive material is removed from over a top surface of the insulator layer, e.g., by a chemical mechanical polishing (CMP) process, leaving conductive features formed in the insulating material layer 216. The conductive features formed may comprise conductive lines, contacts, or contact pads, for example. The structure shown in FIG. 3 in a top view may be contact pads that comprise relatively large square or rectangle patterns, that may later be wire bonded to other integrated circuits or to leads of a package, as examples.

The layer of resist 208/210 is also referred to herein as a masking material. The masking material 208/210 may alternatively comprise an insulating material, an oxide, a nitride, a semiconductive material, and/or a conductive material, as examples. The insulating material layer 216 may also comprise other materials, such as conductors or semiconductive materials, as examples. The insulating material layer 216 may be filled with material other than conductive materials, such as insulators, semiconductive materials, conductive materials and/or combinations thereof, as examples.

The ribs 210 preferably extend between the vias 206 formed in an adjacent insulating material layer, such as the insulating material layer 204 disposed beneath the layer of resist 208/210, in one embodiment, as shown in FIG. 3. The ribs 210 may also extend between vias formed in an overlying insulating material layer, not shown, for example. Preferably, after the pattern in the layer of resist 208/210 is used to pattern the insulating material layer 216, the vias 206 in the underlying insulating material layer 204 are left exposed, so that when the patterned insulating material layer 216 is filled with a conductive material, as shown in a cross-sectional view in FIGS. 7 and 8, the conductive material 212 will make electrical contact with the vias 206, for example.

The novel ribs 210 for resist lines 208 may comprise other shapes, such as rectangles, triangles, curves, half circles, half ellipses, or other geometrical shapes. For example, the ribs 210 may comprise triangular shapes, as shown in a top view in FIG. 4. As another example, the ribs 210 may comprise a curved shape such as a half circle, as shown in a top view in FIG. 5. The ribs 210 may alternatively comprise two or more different shapes disposed along an edge of a resist line 208, for example, not shown.

FIGS. 6 through 8 show cross-sectional views of a semiconductor device 200 manufactured in accordance with a preferred embodiment of the present invention at various stages of manufacturing. The manufacturing steps used to fabricate the semiconductor device 200 will next be described.

First, a workpiece 202 is provided. The workpiece 202 may include a semiconductor substrate comprising silicon or other semiconductor materials covered by an insulating material layer, for example. The workpiece 202 preferably includes active areas comprising electrical components and/or circuits formed over and/or within the workpiece 202, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate.

Next, a metallization layer 204/206 is formed over the workpiece 202. The metallization layer 204/206 may be formed using a subtractive etch process by depositing a conductive material over the workpiece 202, patterning and etching the conductive material to form vias 206, and depositing an insulating material layer 204 between the conductive features 206. Alternatively, the metallization layer 204/206 may be formed using a single damascene process, by depositing the insulating material layer 204, patterning the insulating material layer 204, and filling the insulating material layer 204 with a conductive material to form the vias 206. In another embodiment, the insulating material layer 204 may be patterned with a pattern for vias 206, and may be filled with a conductive material in a later manufacturing step, e.g., in a dual damascene process, to be described further herein. The insulating material layer 204 is also referred to herein as a first insulating material layer.

In one embodiment, the insulating material layer 204 preferably comprises a dielectric material. For example, the insulating material layer 204 may comprise a low dielectric constant (k) material, having a dielectric constant of about 3.5 or lower, in one embodiment. Alternatively, the insulating material layer 204 may comprise a dielectric constant of about 3.5 or greater, in another embodiment, for example. The insulating material layer 204 may comprise $SiO_2$, SiON, or fluorinated silicon glass (FSG), as examples, although the insulating material layer 204 may alternatively comprise other materials and combinations thereof. The insulating material layer 204 may comprise a thickness of about 5000 Angstroms or less, and in one embodiment, preferably comprise a thickness of about 2000 to about 4000 Angstroms, for example, although the insulating material layer 204 may alternatively comprise other thicknesses. The insulating material layer 204 may be deposited by chemical vapor deposition (CVD), by a spin-on process, as examples, although alternatively, the insulating material layer 204 may be formed using other methods.

In one embodiment, the vias 206 preferably comprise a metal, and may include a conductive liner to improve adhesion and function as a diffusion barrier, as examples (not shown). The vias 206 preferably comprise copper, a copper alloy, aluminum, an aluminum alloy, tungsten, a tungsten alloy, or combinations thereof, as examples, although alternatively, the vias 206 may comprise other materials.

An insulating material layer 216 is deposited or formed over the insulating material layer 204 and vias 206, as shown in FIG. 6. The insulating material layer 216 is also referred to herein as a second insulating material layer and a first material layer, as examples. The insulating material layer 216 may comprise similar materials and thicknesses as described for the insulating material layer 204, for example, although alternatively, the insulating material layer 216 may comprise other materials.

Figure 4:
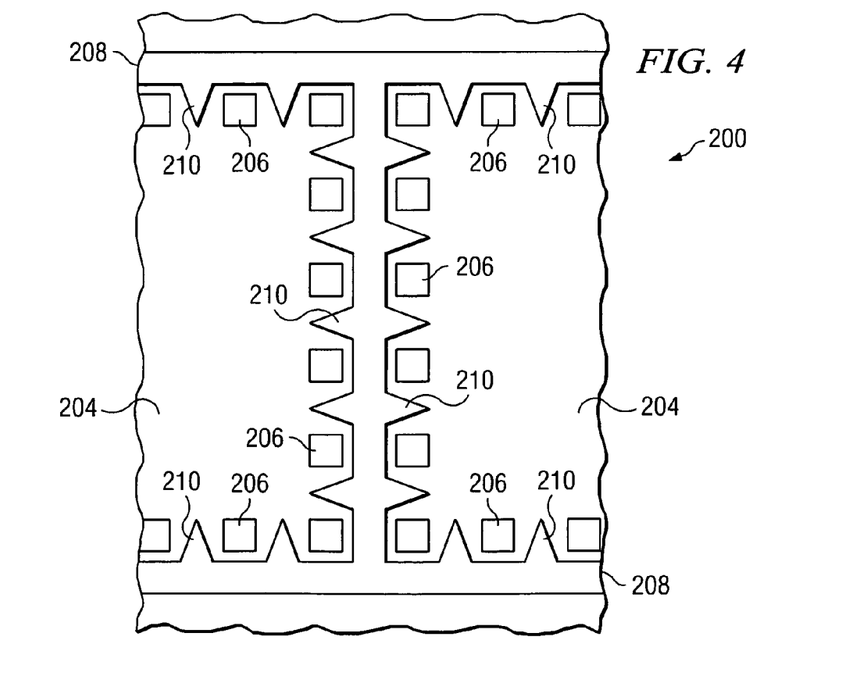
FIG. 4 shows a top view of another embodiment of the present invention, wherein the ribs extending from the resist lines are triangular-shaped.
Figure 5:
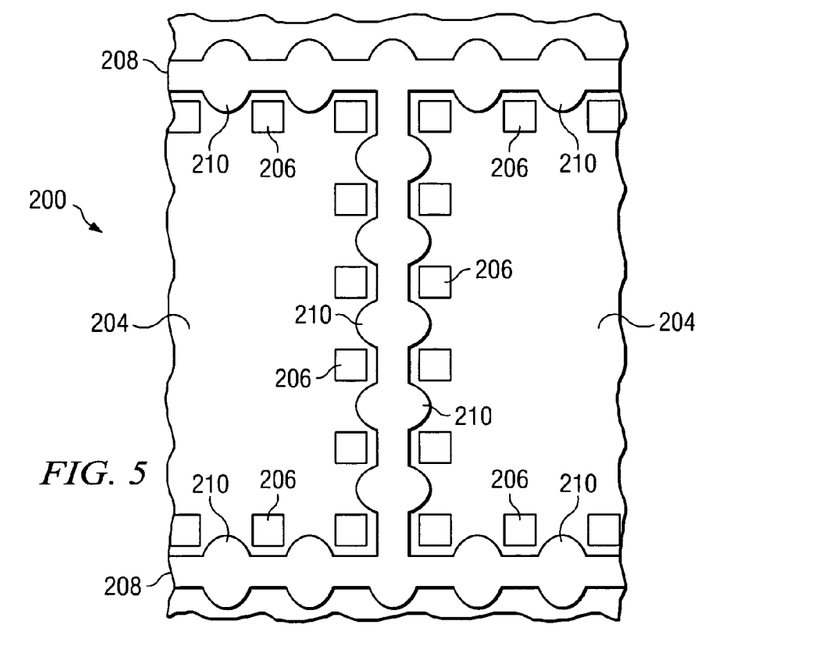
FIG. 5 shows a top view of yet another embodiment of the present invention, wherein the ribs extending from the resist lines are curved.

A masking material 208/210 is deposited over the insulating material layer 216, as shown in FIG. 6 and in a top view in FIGS. 3, 4 and 5. The masking material 208/210 may comprise a photoresist, in a preferred embodiment. The masking material 208/210 may include a hard mask such as an oxide or nitride material, in one embodiment. The masking material 208/210 may comprise a thickness of about 5000 Angstroms or less, for example, and may be depositing using a spin-on process or other methods, as examples. The masking material 208/210 is patterned with a desired pattern for lines 208 (not shown in FIG. 6; see FIGS. 3, 4, and 5) and ribs 210 that are integral to the lines 208 and extend from the lines 208.

A material 212, preferably comprising a conductive material in one embodiment, is deposited over the patterned masking material 208/210 to fill the patterns in the masking material 208/210. The conductive material 212 may comprise similar materials as described for vias 206, for example, and is also referred to herein as a second material layer. An excess amount of conductive material 212 may be deposited, as shown at 214 in FIG. 7, over the insulating material layer 216. The excess conductive material 212 is removed from the top surface of the insulating material layer 216, e.g., using a CMP and/or etch process, forming conductive features 212 within the patterned insulating material layer, as shown in FIG. 8. The masking material 208/210 is then removed, e.g., using an ash or etch process, for example.

In one embodiment, a dual damascene process may be used to simultaneously form the conductive features 212 and the underlying vias 206, for example. In this embodiment, the vias 206 are not filled with conductive material before the deposition of the insulating material layer 216. The insulating material layers 204 and 216 may comprise two separate insulating material layers 204 and 216 comprised of the same or different materials. Alternatively, the insulating material layers 204 and 216 may comprise a single insulating material layer, for example.

In the dual damascene embodiment, the insulating material layers 204 and 216 are patterned with two patterns; e.g., a first pattern for vias 206, and a second pattern for conductive features 212. Two lithography masks may be used to pattern the insulating material layers 204 and 216, for example. Conductive material is then deposited over the insulating material layers 204 and 216 to fill the patterns and form the conductive features 212 and the vias 206, and excess conductive material is removed from the top surface of the insulating material layer 216. The insulating material layer 216 pattern includes the novel rib pattern that is transferred to the layer of resist 208/210 used to pattern the insulating material layer 216.

In the embodiments described herein, an optional liner may be formed before the conductive materials are deposited (not shown). The liners are preferably relatively thin, to minimize the impact on the conductivity of the conductive features 212 and the vias 206, for example. The liners may comprise Ta, TaN, a copper seed layer, or multiple layers or combinations thereof, and preferably comprise a thickness of about 50 nm or less, as examples, although alternatively, the optional liners may comprise other materials and thicknesses.

Figure 9A:
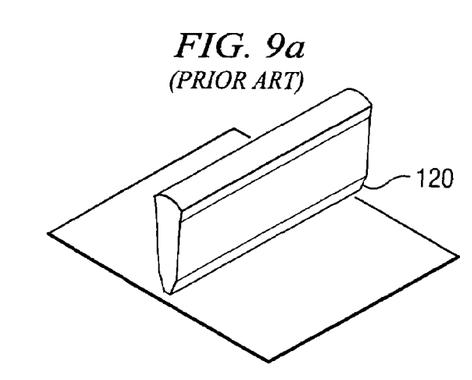
FIGS. 9a, 9b, and 9c show simulation results of the thin resist line shown in FIGS. 1 and 2 in a 3D profile, a cross-sectional profile, and the contour thereof at the bottom, respectively.
Figure 9B:
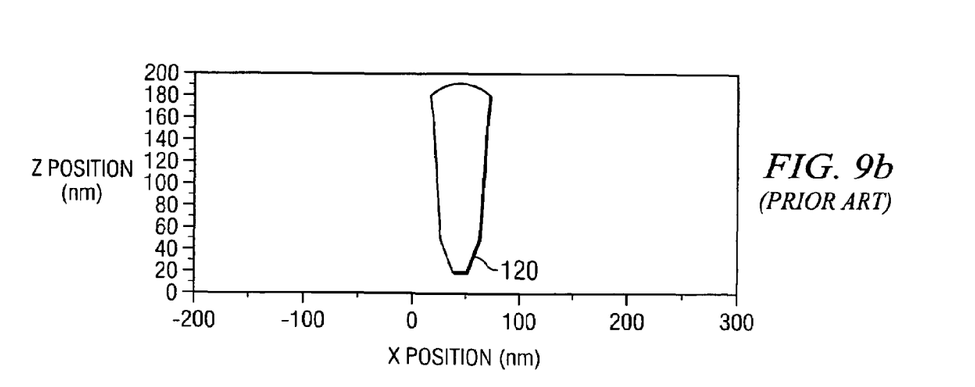
Figure 9C:
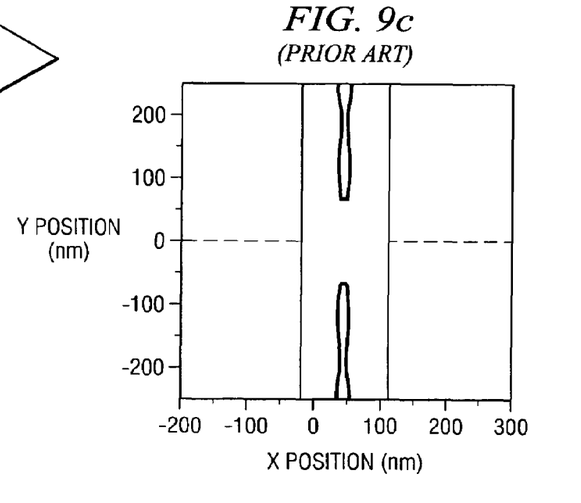

FIGS. 9a, 9b, 9c, 10a, 10b, 10c, 11, 12a, 12b, 12c, 13a, 13b, 13c, 14a, 14b, and 14c show simulation results of resist lines with and without the use of the novel ribs of the present invention. Referring next to FIGS. 9a, 9b, and 9c, simulation results of the prior art thin resist line shown in FIGS. 1 and 2 are shown in a 3D profile, a cross-sectional profile, and the contour thereof at the bottom, respectively. These simulation results illustrate that prior art resist lines 108 (see FIGS. 1 and 2) are thin and fragile. The resist 108 contour tends to be thin at the bottom, as shown at 120 in FIGS. 9a and 9b. FIG. 9c shows the resist 108 line contour at the bottom of the resist line. In FIG. 9c, the correct (e.g., the desired) resist profile is shown, along the center line on the x axis. Beyond this center line, the simulation results give a certain level of noisy resist contour, which actually is not there. Thus, prior art resist lines 108 are thin at the bottom, leading to collapse of the resist lines 108, which results in shorted conductive features and device failures.

Figure 10A:
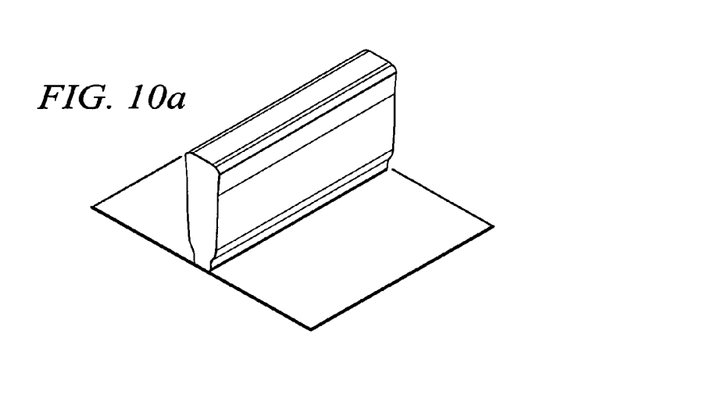
FIGS. 10a, 10b, and 10c show simulation results of the thin resist line having a plurality of ribs extending therefrom in accordance with an embodiment of the present invention, in a 3D profile, a cross-sectional profile, and the contour thereof at the bottom, respectively.
Figure 10B:
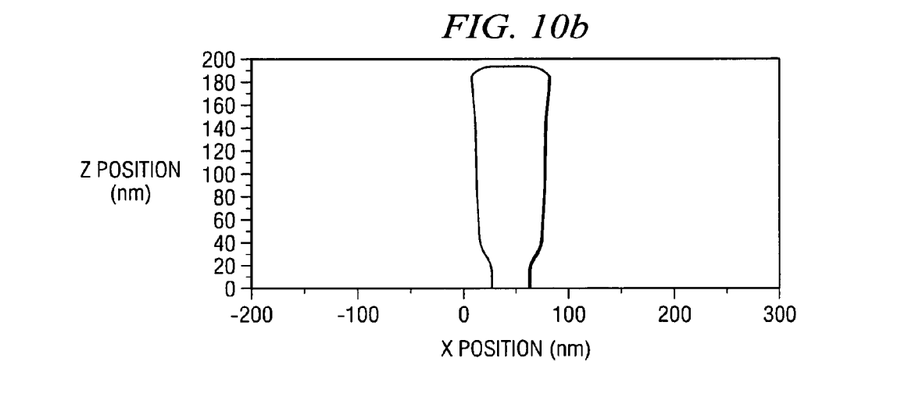
Figure 10C:
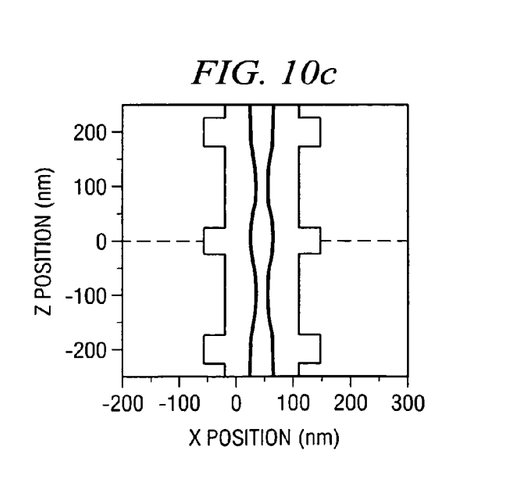

FIGS. 10a, 10b, and 10c show simulation results of a thin resist line 208 having a plurality of ribs 210 extending therefrom in accordance with an embodiment of the present invention, in a 3D profile, a cross-sectional profile, and the contour thereof at the bottom, respectively. The thickness of the resist line 208 having ribs is greater at the bottom than in prior art resist lines 108 having no ribs.

Figure 11:
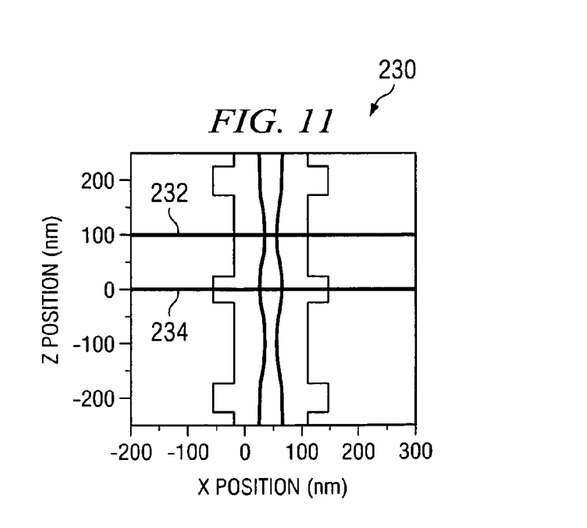
FIG. 11 shows the two locations the simulation results were calculated, at the center of a rib, and between two ribs, the results of which are shown in FIGS. 12b, 12c 13b, 13c, 14b and 14c.

FIG. 11 shows at 230 the two locations that simulation results were calculated at, at the center of a rib 208, at 234 and between two ribs 208, e.g., 100 nm from the center of a rib 208, at 232. The results of the simulation at these locations of a resist line 208 having ribs 210 are shown in FIGS. 12b, 12c, 13b, 13c, 14b and 14c.

Figure 12A:
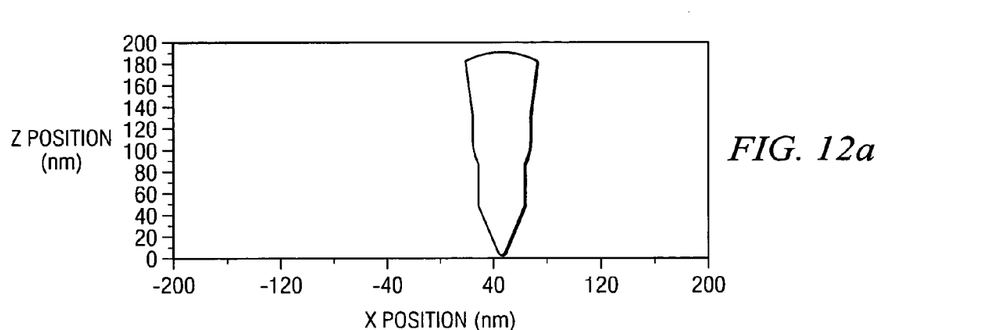
FIG. 12a shows a result of a focus simulation of a resist line having no ribs.
Figure 12B:
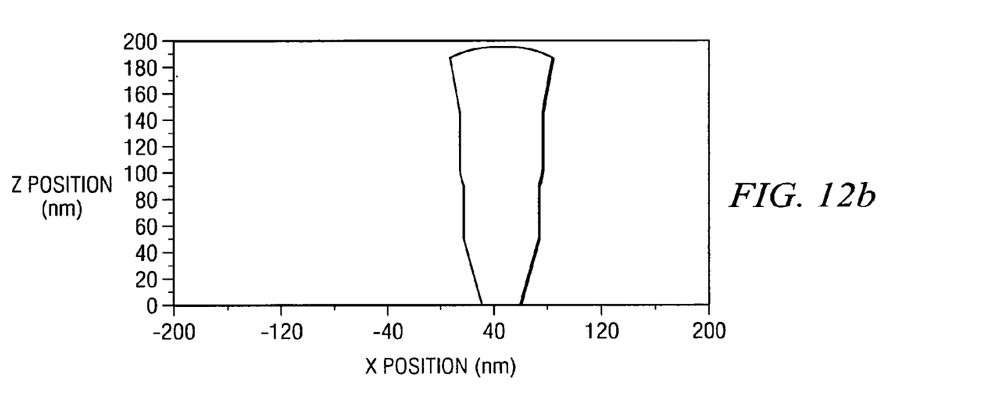
FIGS. 12b and 12c shows results of focus simulations of the resist line of Figure 12a that includes ribs in accordance with an embodiment of the present invention at the center of a rib and between two ribs, respectively.
Figure 12C:
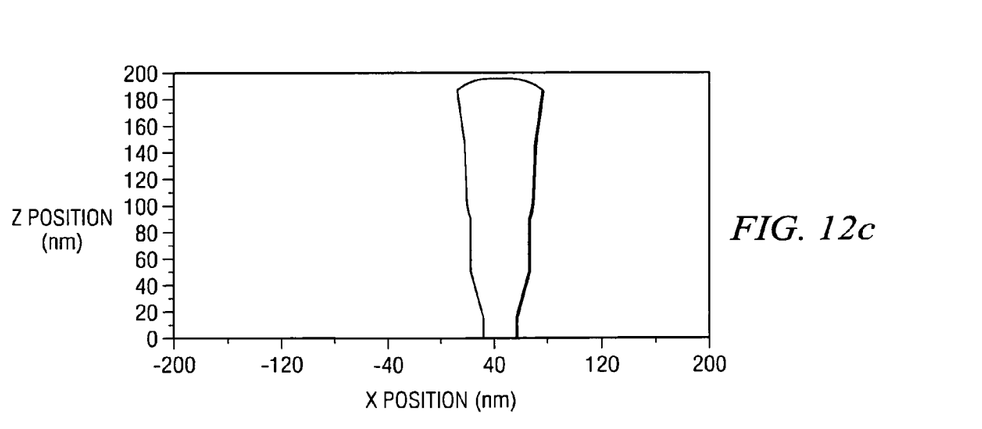

FIGS. 12a, 12b, and 12c show simulation results of resist lines 108 and 208 at a focus of −0.1 µm. FIG. 12a shows a result of a focus simulation of a resist line 108 having no ribs and having a thin cross-section at the bottom. FIGS. 12b and 12c shows results of focus simulations of a resist line 208 that includes ribs 210 in accordance with an embodiment of the present invention at the center of a rib 210 and between two ribs 210, respectively. The cross-section of the resist line 208 is thicker for the resist line 208 at the bottom, both at the center of the rib 210 (FIG. 12b) and also between the ribs 210 (FIG. 12c). Thus, the ribs 210 improve the lithography process results not only for the area of the resist line 208 adjacent the ribs 210, but also in areas of the resist line 208 spaced away from the ribs 210, by making the resist line 208 thicker at the bottom and also over the entire width of the resist line 208, at this focus level.

Figure 13A:
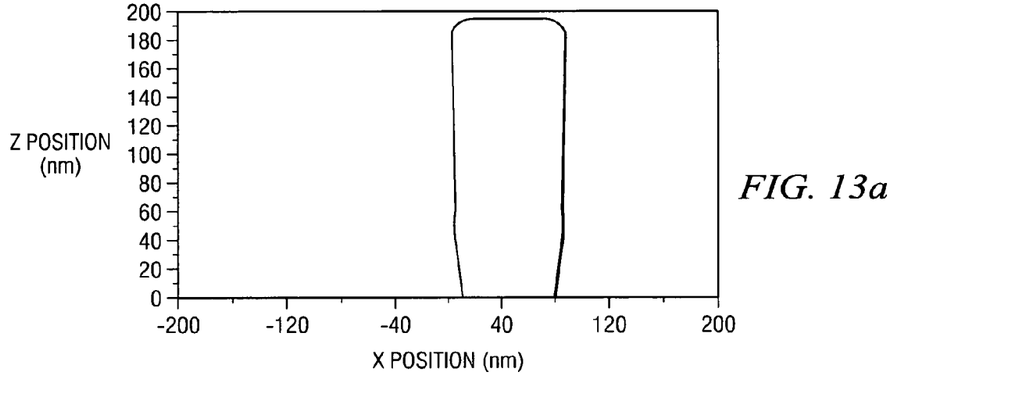
FIG. 13a shows another result of a focus simulation of a resist line having no ribs.
Figure 13B:
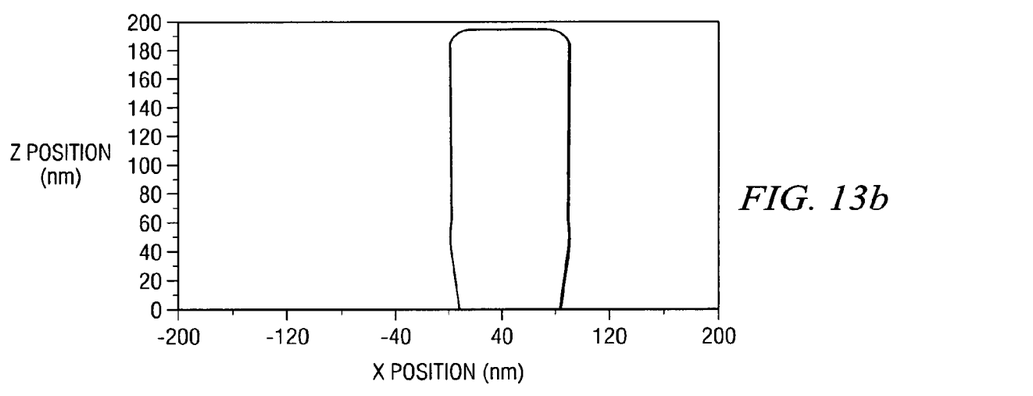
FIGS. 13b and 13c shows results of focus simulations the resist line of FIG. 13a having ribs in accordance with an embodiment of the present invention at the center of a rib and between two ribs, respectively.
Figure 13C:
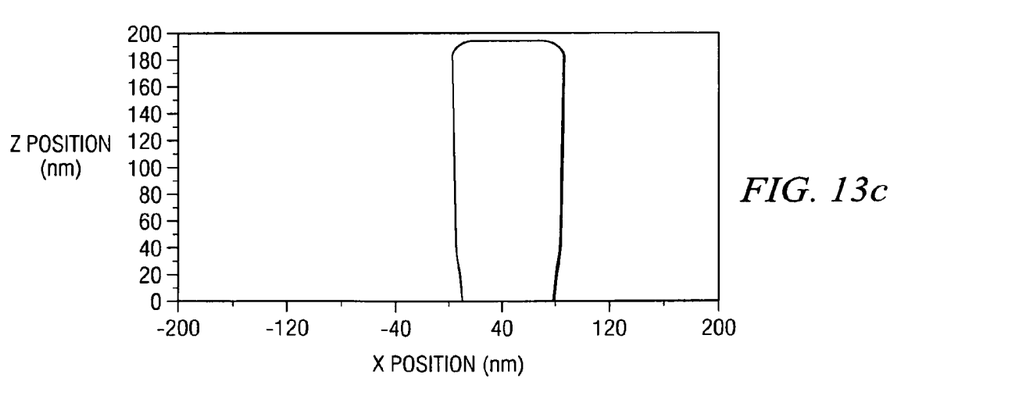

FIGS. 13a, 13b, and 13c show simulation results of resist lines 108 and 208 at a focus of 0 µm. FIG. 13a shows another result of a focus simulation of a resist line 108 having no ribs, and FIGS. 13b and 13c shows results of focus simulations of a resist line 208 having ribs 210 in accordance with an embodiment of the present invention at the center of a rib 210 and between two ribs 210, respectively. Again, an increase in the thickness of the resist line 208 is seen with the use of the novel ribs 210 in accordance with embodiments of the present invention at this focus level.

Figure 14A:
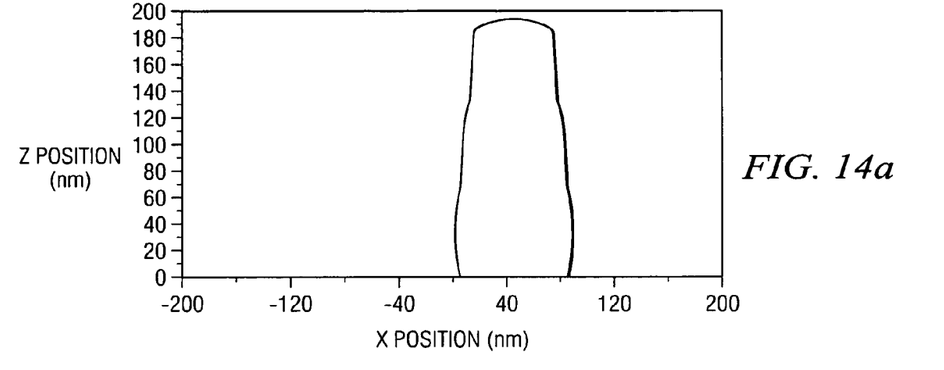
FIG. 14a shows another result of a focus simulation of a resist line having no ribs.
Figure 14B:
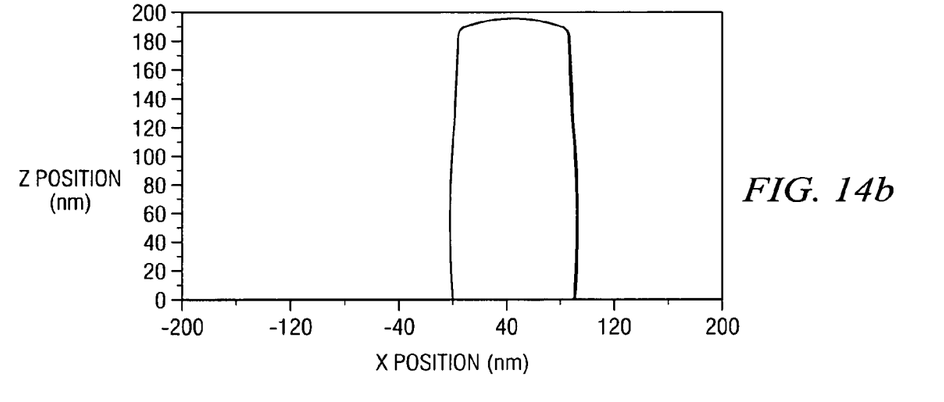
FIGS. 14b and 14c shows focus simulation results of the resist line of FIG. 14a having ribs in accordance with an embodiment of the present invention at the center of a rib and between two ribs, respectively.
Figure 14C:
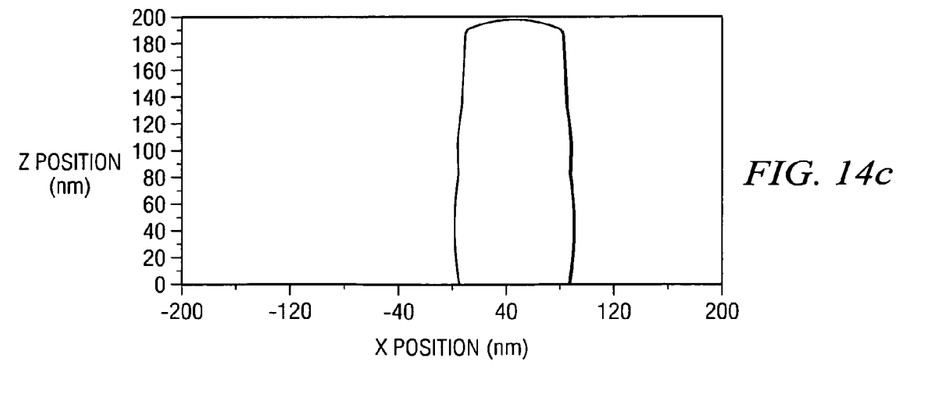

FIGS. 14a, 14b, and 14c show similar simulation results as shown in FIGS. 12a, 12b, 12c, and FIGS. 13a, 13b, 13c, at a focus of +0.15 µm. The cross-section of the resist line 208 profile again is increased with the use of a rib 210 in the resist line pattern.

The pattern for the novel ribs 210 described herein is preferably added to the lithography mask design after the mask design has been adjusted by OPC in one embodiment, to avoid increasing the complexity of and the time required for OPC, for example. If the rib 210 pattern is added to the lithography mask post OPC, data volume is decreased and OPC run time is reduced. However, alternatively, the pattern for the ribs 210 may also be generated prior to OPC, for example.

One embodiment of the present invention comprises a method of designing a semiconductor device, comprising determining a layout for a damascene structure, and adding a plurality of ribs 210 to the layout for the damascene structure. Each of the plurality of ribs 210 extends from the damascene structure to provide mechanical support for the damascene structure.

In another embodiment, a semiconductor device includes a workpiece 202, a plurality of vias 206 formed in a first insulating material layer 204 disposed over the workpiece 204, and a plurality of conductive features 212 formed in a second insulating material layer 216 disposed over the plurality of vias 206 and the first insulating material layer 204, as shown in a cross-sectional view in FIG. 8, and in a top view in FIGS. 3, 4 and 5. Each of the plurality of conductive features 212 comprises a plurality of ribs, e.g., that comprise a negative image or pattern from the pattern of the ribs 210 in the second insulating material layer 216, disposed at the perimeter thereof. At least one of the plurality of ribs extends over a via 206 in the underlying first insulating material layer 204, as shown in FIG. 8. Thus, the rib 210 pattern is visible as a negative image (e.g., of the rib 210 pattern in the layer of resist 208/210) in the conductive features 212 formed in a damascene process.

The novel ribs 210 for resist lines 208 provide technical advantages both structurally and also in the lithography process. The ribs 210 provide structural support for the thin resist lines 208 along the length of the resist lines 208, mechanically strengthening the resist lines 208. In addition, the presence of the rib pattern in the lithography mask improves the lithography process by making the resist lines 208 thicker, due to the diffraction effects around the ribs. The ribs 210 function similar to a serif or other OPC features in this respect. The presence of the rib pattern in the lithography mask causes the resist lines 208 to be thicker at a bottom portion proximate the underlying material layer, making the resist lines 208 more robust and less likely to collapse. The ribs 210 are particularly useful in increasing the resist line 208 material thickness at the bottom when a negative focus is used, as can be seen in FIGS. 12a, 12b, and 12c. The novel ribs 210 may be used to pattern single and dual damascene structures. The ribs 210 may be added to the lithography mask pattern after OPC is performed on the lithography mask data, reducing the amount of time required and complexity of the OPC calculations.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
   depositing a first insulating layer over a workpiece;
   patterning the first insulating layer forming recess for vias in the first insulating layer;
   depositing a second insulating layer on the first insulating layer;
   depositing a masking material of a first thickness over the second insulating layer;
   patterning the masking material with a pattern for a damascene structure, the pattern comprising a resist line and ribs extending from the resist line, wherein the resist line is oriented along a first direction, and parallel to a first and a second dummy via, wherein the ribs are disposed along a line parallel to the first direction, wherein a single rib of the ribs is disposed between the first and the second dummy vias, wherein the resist line comprises a first top critical dimension between the first dummy via and a third dummy via along a second direction, the second direction being perpendicular to the first direction, wherein the resist line comprises a second top critical dimension between the ribs along the second direction, the second top critical dimension being wider than the first top critical dimension;
   etching recesses for metal lines using the resist line as a mask; and
   filling the recesses for metal lines and vias with conductive material.

2. The method according to claim 1, wherein the ribs of the pattern for the damascene structure provide mechanical support for the patterned masking material.

3. The method according to claim 1, wherein the masking material comprises a photo resist.

4. The method according to claim 1, wherein the conductive material comprises depositing copper, tungsten, a semiconductive material, or alloys or combinations thereof.

5. The method according to claim 1, wherein the ribs comprise a shape, the shape comprising a square, rectangle, triangle, curve, half circle, or half ellipses.

6. The method according to claim 1, wherein the ribs are not disposed directly above the dummy vias.

7. A method of fabricating a semiconductor device, the method comprising:
   depositing a first insulating material layer over a workpiece;
   depositing a second insulating material layer over the first insulating material layer;
   patterning the first insulating material layer and the second insulating material layer with a pattern for vias, the vias comprising a first via, a second via and a third via, wherein the first and the second vias are arranged along a first direction, and wherein the first and the third vias are arranged along a second direction, the second direction being perpendicular to the first direction;

depositing a layer of resist over the second insulating material layer;

patterning the layer of resist, the patterned layer of resist forming a ridge of resist with substantially vertical sidewalls, wherein the ridge of resist comprises ribs, wherein the ridge of resist is oriented in the first direction, wherein the ribs are disposed along the first direction between the underlying first and second vias, wherein the ridge of resist comprises a first top critical dimension along the second direction, the first top critical dimension measured along a line connecting the first via to the third via, wherein the ridge of resist comprises a second top critical dimension between the ribs along the second direction, the second top critical dimension being wider than the first top critical dimension;

using the layer of resist as a mask to pattern the second insulating material layer;

removing the patterned layer of resist;

depositing a first conductive material over the second insulating material layer, leaving excess first conductive material over a top surface of the second insulating material layer; and removing the excess first conductive material from over the top surface of the second insulating material layer.

8. The method according to claim 7, wherein the ribs provides mechanical support for the patterned layer of resist.

9. The method according to claim 7, wherein the ribs comprise a shape, the shape comprising a square, rectangle, triangle, curve, half circle, or half ellipses.

10. The method according to claim 7, wherein depositing the first conductive material fills the pattern for the vias in the first insulating material layer.

11. The method according to claim 7, further comprising depositing a second conductive material over the first insulating material layer to fill the pattern for the vias, and removing an excess amount of second conductive material from over a top surface of the first insulating material layer, before depositing the second insulating material layer.

12. The method according to claim 7 wherein a width of the ridge of resist at a top surface and a bottom surface are about the same.

13. The method according to claim 7, wherein the ribs are not disposed directly above the pattern for vias.

14. The method according to claim 13, wherein a first thickness of the layer of resist is at least three times the first top critical dimension.

15. A method of designing a semiconductor device, the method comprising:

determining a layout for a damascene structure, the damascene structure comprising at least one perpendicular resist line and at least one horizontal resist line; and adding a plurality of ribs to the layout for the damascene structure, wherein each of the plurality of ribs extends from the damascene structure to provide mechanical support for the damascene structure, wherein the plurality of ribs are designed to be disposed above underlying vias, but are laterally displaced and not vertically above underlying vias, and wherein the plurality of ribs is disposed between adjacent underlying vias, wherein the adjacent underlying vias are disposed alone a line parallel to the least one perpendicular resist line.

16. The method according to claim 15, further comprising performing optical proximity correction to the layout for the damascene structure, before adding the plurality of ribs.

17. The method according to claim 15, wherein determining the layout for the damascene structure comprises determining a layout for a plurality of conductive features, further comprising determining a layout for a plurality of vias disposed below the plurality of conductive features, wherein adding the plurality of ribs to the layout for the damascene structure comprises extending at least one of the plurality of ribs between two of the plurality of vias.

18. A method of fabricating a semiconductor device using a copper damascene process, the method comprising:

depositing a first insulating material layer over a workpiece;

depositing a second insulating material layer over the first insulating material layer;

patterning the first insulating material layer and the second insulating material layer with a pattern for vias;

depositing a layer of resist over the second insulating material layer; and patterning the layer of resist to form a ridge of resist, wherein a height of the ridge of resist is at least about three times greater than a width of the ridge of resist, wherein the ridge of resist comprises ribs, wherein at least one of the ribs extends between adjacent vias in the underlying first insulating material layer, and wherein the adjacent vias are disposed along the ridge of resist.

19. The method of claim 18, further comprising:

using the layer of resist as a mask to pattern the second insulating material layer;

removing the patterned layer of resist;

depositing a first conductive material over the second insulating material layer, leaving excess first conductive material over a top surface of the second insulating material layer; and removing the excess first conductive material from over the top surface of the second insulating material layer to form patterned metal lines.

20. The method of claim 19, wherein the ridge of resist comprises substantially vertical sidewalls.

21. The method of claim 20, wherein the patterned metal lines comprise substantially vertical sidewalls formed due to the substantially vertical sidewalls of the ridge of resist.

22. The method according to claim 18, wherein the ridge of resist is oriented in a first direction, wherein the ribs are disposed along a line parallel to the first direction between the adjacent underlying vias, wherein the ridge of resist comprises a first top critical dimension between the underlying vias along a second direction, the second direction being perpendicular to the first direction, wherein the ridge of resist comprises a second top critical dimension between the ribs along the second direction, the second top critical dimension being wider than the first top critical dimension.

* * * * *